(12) United States Patent
Hayashi et al.

(10) Patent No.: US 7,684,231 B2
(45) Date of Patent: Mar. 23, 2010

(54) METHODS AND APPARATUS FOR LOW POWER SRAM BASED ON STORED DATA

(75) Inventors: Atsushi Hayashi, Kanagawa (JP);
Shunsaku Tokito, Austin, TX (US);
Hiroshi Yoshihara, Round Rock, TX (US); Yuuki Fujiyama, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 479 days.

(21) Appl. No.: 11/609,631

(22) Filed: Dec. 12, 2006

(65) Prior Publication Data
US 2008/0137451 A1    Jun. 12, 2008

(51) Int. Cl.
*G11C 11/00* (2006.01)

(52) U.S. Cl. .................. 365/154; 365/189.07; 365/190; 365/227

(58) Field of Classification Search .................. 365/154, 365/189.07, 190, 227
See application file for complete search history.

(56) References Cited

U.S. PATENT DOCUMENTS 7,280,412 B2 *  10/2007  Jang et al. ............... 365/189.07
7,310,281 B1 *  12/2007  Hsueh et al. ................. 365/222

* cited by examiner

*Primary Examiner*—Anh Phung
*Assistant Examiner*—Toan Le
(74) *Attorney, Agent, or Firm*—Matthew B. Dernier, Esq.; Gibson & Dernier LLP

(57) ABSTRACT

Methods and apparatus provide for controlling an SRAM memory, the SRAM memory including a plurality of memory cells arranged in an array of rows (word lines) and columns (bit lines), comprising: inverting a state of data for input to one or more columns of the array; and storing the inverted data in one or more memory cells of the one or more columns.

18 Claims, 5 Drawing Sheets

100

METHODS AND APPARATUS FOR LOW POWER SRAM BASED ON STORED DATA

BACKGROUND

The present invention relates to methods and apparatus for controlling static random access memory (SRAM), and in particular for reducing the power dissipation of the SRAM based on the data stored therein.

SRAM memory cells store data in the form of complementary low voltage and high voltage at opposite sides of the cell. An SRAM, unlike dynamic random access memory (DRAM), maintains the data content of the memory calls as long as power is applied to the cell. DRAM memory cells, on the other hand, are periodically refreshed with the stored data content. An SRAM cell includes a "true" node associated with a bit line of the SRAM memory and a complementary node associated with a complementary bit line of the SRAM memory. When the true node is read as a high voltage, the value of the SRAM memory cell is digital one. If the true node is read as a low voltage, the value of the SRAM memory cell is a digital zero.

During write and read cycles, a conventional SRAM memory system will employ a pre-charge circuit to drive the bit line and the complementary bit line to a power supply voltage of the SRAM memory, Vdd, before data is written to the memory cell. During the time that the data is actually written to the SRAM memory cell, a write buffer drives the bit line and the complementary bit line. During the read operation, the active components of the SRAM memory cell itself will drive the bit line, which is sensed to determine the value of the stored data bit in the cell. The amount of power consumed and dissipated by an SRAM memory cell during a read operation depends on the value of the data stored in the cell. In general, when the stored data bit is such that the true node is low (which is usually associated with a stored data bit at logic level 0) the cell consumes and dissipates more power than when the stored data bit is such that the true node is high (which is usually associated with a stored data bit at logic level 1).

Successive read cycles of a plurality of SRAM memory cells (in which the stored data are at a logic level 1) at a relatively high frequency clock will produce significant power dissipation in the SRAM memory. The power dissipation problem becomes significantly worse as the frequency of the clock increases and the size of the SRAM increases, which is an ongoing circumstance as higher and higher memory performance remains a design goal.

Accordingly, there is a need in the art for a new approach to controlling SRAM memory cells in order to counteract the increase in power dissipation resulting from higher and higher clock frequencies and larger and larger SRAM memories.

SUMMARY OF THE INVENTION

In accordance with one or more embodiments of the invention, a statistical analysis is made to determine whether there are any bit positions (columns) of the SRAM array that are more likely to be "0" than "1" from word-line to word-line. (This may be the case for status bits, ECC error bits, certain instructions, failure bit positions, etc.) If certain bit positions are more likely to be "0" than "1", then the data stored and read out at such bit positions are inverted in all word lines. This can be implemented by introducing appropriate combinational logic between the data input line and the BLT, BLC lines of each cell at the appropriate bit positions.

In accordance with one or more embodiments of the invention, methods and apparatus provide for controlling an SRAM memory, the SRAM memory including a plurality of memory cells arranged in an array of rows (word lines) and columns (bit lines), including: inverting a state of data for input to one or more columns of the array; and storing the inverted data in one or more memory cells of the one or more columns.

The methods and apparatus further provide for accessing the inverted data from the one or more memory cells; and inverting the state of the inverted data.

In accordance with one or more embodiments, the methods and apparatus may provide for performing analysis of data for input into the array to determine whether the data for input to the one or more columns are more likely to cause a higher level of power consumption during a read operation than without the inversion step. By way of example, the determination may be in the affirmative when a number of data bits in the one or more columns are more likely to be at a logic level low. By way of further example, a given data bit in the one or more columns may be a logic level low when a true node (BLT) of the associated memory cell is at a low voltage potential and a complementary node (BLC) of the associated memory cell is at a higher voltage potential than the true node (BLT).

The methods and apparatus may further include: determining whether one or more of the columns of the array are not to be used in a normal mode of operation; and storing data in at least one of the one or more columns having values that are more likely to cause a lower level of power consumption during read operations as compared with power consumption that would arise if inverted values of the data existed. By way of example, the values may be logic level high.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
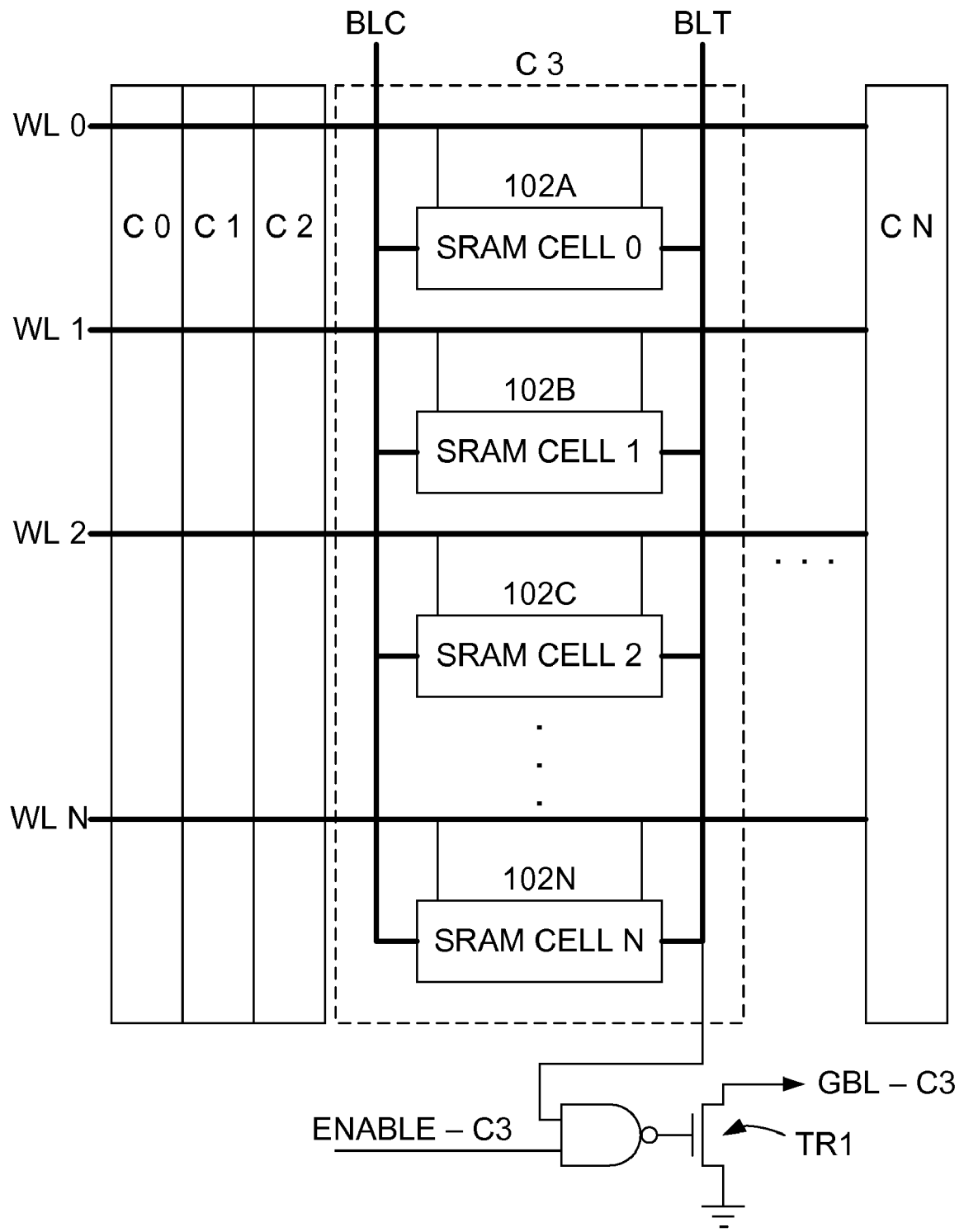
FIG. 1 is a block diagram illustrating an SRAM memory system in accordance with one or more embodiments of the present invention.

With reference to the drawings, wherein like numerals indicate like elements, there is shown in FIG. 1 an SRAM memory system 100 that may be adapted for carrying out one or more features of the present invention. For the purposes of brevity and clarity, the block diagram of FIG. 1 will be referred to and described herein as illustrating an apparatus 100, it being understood, however, that the description may readily be applied to various aspects of a method with equal force.

The SRAM memory system 100 includes a plurality of SRAM memory cells 102 arranged in an array of rows and columns. In general, each row in the array represents a word of data (such as 128 bits in width), and each column in the array represents a given bit position within each word of data. Each word on the SRAM memory system 100 is accessed by activating an associated word line (WL) and bit lines (BLC and BLT). The BLT is the "true" bit line and the BLC is the complementary bit line of the given column, e.g., C3, of the SRAM memory 100. When the true node (or true bit line) is read as a high voltage, the value of the accessed SRAM memory cell 102 is digital one. If the true node is read as a low voltage, the value of the SRAM memory cell 102 is a digital zero.

Sensing circuitry is employed to determine the logic state of the BLT. For example, a NAND gate 104 and a FET transistor TR2 may be employed to sense the voltage potential of the BLT with respect to ground during a read operation. During the read operation, the BLT BLC bit lines are pre-charged and then the active components of the SRAM memory cell 102 itself drives the BLT line, which in turn drives one of the input terminals of the NAND gate 104. The transistor TR1 provides a higher drive capability to establish the logic value on the global bit line GBL, in this case for column three (C3) of the SRAM memory system 100.

Although not shown, one skilled in the art will appreciate that a number of further components of the SRAM memory system 100 may be employed, such as read and write pre-charge circuits, a write buffer, and further components of a sense amplifier, etc.

Figure 2:
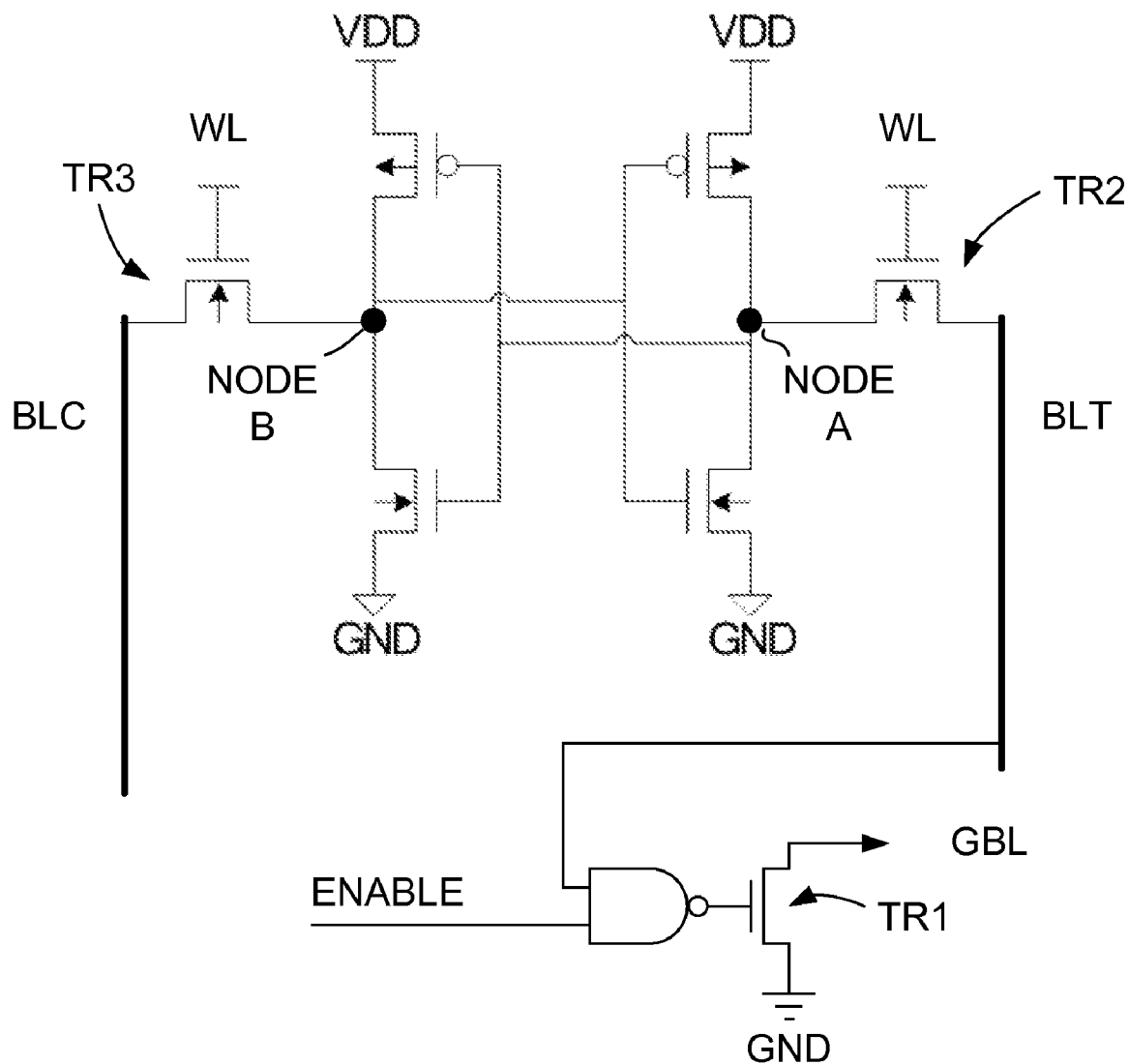
FIG. 2 is a detailed circuit schematic of an embodiment of an SRAM memory cell suitable for use with the system of FIG. 1.

With reference to FIG. 2, a detailed circuit schematic of an example of an SRAM memory cell 102 is illustrated that is suitable for use in the system 100. The SRAM memory cell 102 includes a pair of inverters (or gates) arranged in an anti-parallel configuration. The anti-parallel inverters are implemented using a plurality of (field effect transistors) FETs interconnected such that storage nodes A, B are associated with true bit line BLT and complementary bit line BLC, respectively. For the purposes of illustration, it is assumed that node A is a "true" node and node B is a "complementary" node, which are coupled to the true bit line BLT and the complementary bit line BLC by way of respective NMOS transistors TR2 and TR3. It is noted that while NMOS technology is a preferred implementation for transistors TR2 and TR3, other technologies may be employed without departing from the embodiments of the invention.

The NMOS transistors TR1 and TR3 are controlled by a word line WL signal, which typically activates a plurality of SRAM memory cells used to store a single word of data. The SRAM memory cell 102 includes a PMOS transistor and an NMOS transistor connected in series across the power supply potential, Vdd to Vss (or ground). The true node A is located at the common connection between the PMOS and NMOS transistors. A second set of PMOS and NMOS transistors are interconnected to produce the complementary node B. Again, although this specific circuit topology and implementation is suitable for carrying out one or more embodiments of the invention, those skilled in the art will recognize from the description herein that other implementations are within the scope of the invention.

A bit of data is written to the SRAM memory cell 102 by turning on the respective NMOS transistors via the word line WL and presenting a potential voltage across the bit line BLT and the complementary bit line BLC. For example, when the bit line BLT is driven to the Vdd potential and the complementary bit line BLC is driven to Vss (e.g., ground), then the PMOS transistor associated with the true node A will turn on, the NMOS transistor associated with the true node A will turn off, the PMOS transistor associated with the complementary node B will turn off, and the NMOS transistor associated with the complementary node B will turn on. Thus, the true node A will be substantially at the Vdd voltage potential and the complementary node B will be substantially at the Vss (or ground) voltage potential. Those skilled in the art will appreciate that an opposite condition will be achieved when the voltage potentials driving the bit line BLT and the complementary bit line BLC are reversed.

In accordance with this embodiment of the present invention, a high voltage potential (e.g., Vdd) on the true node A and a relatively low voltage potential (e.g., ground) on the complementary node B is interpreted as a logic high or digital one. Conversely, a relatively low voltage potential on the true node A and a relatively high voltage potential on the complementary node B is interpreted as a logic low or digital zero. During a read operation, if true node A is low, the power dissipation in the memory cell 102 is relatively high because current flows through two transistors TR1 and TR2. Conversely, if the true node A is high, the power dissipation in the memory cell is relatively lower because current flows through only one transistor TR3.

It is noted that the read and write pre-charge circuits (not shown) operate to drive the voltage on the bit line BLT and the complementary bit line BLC to certain voltage potentials prior to a read operation or a write operation to the SRAM memory cell 102.

Figure 3:
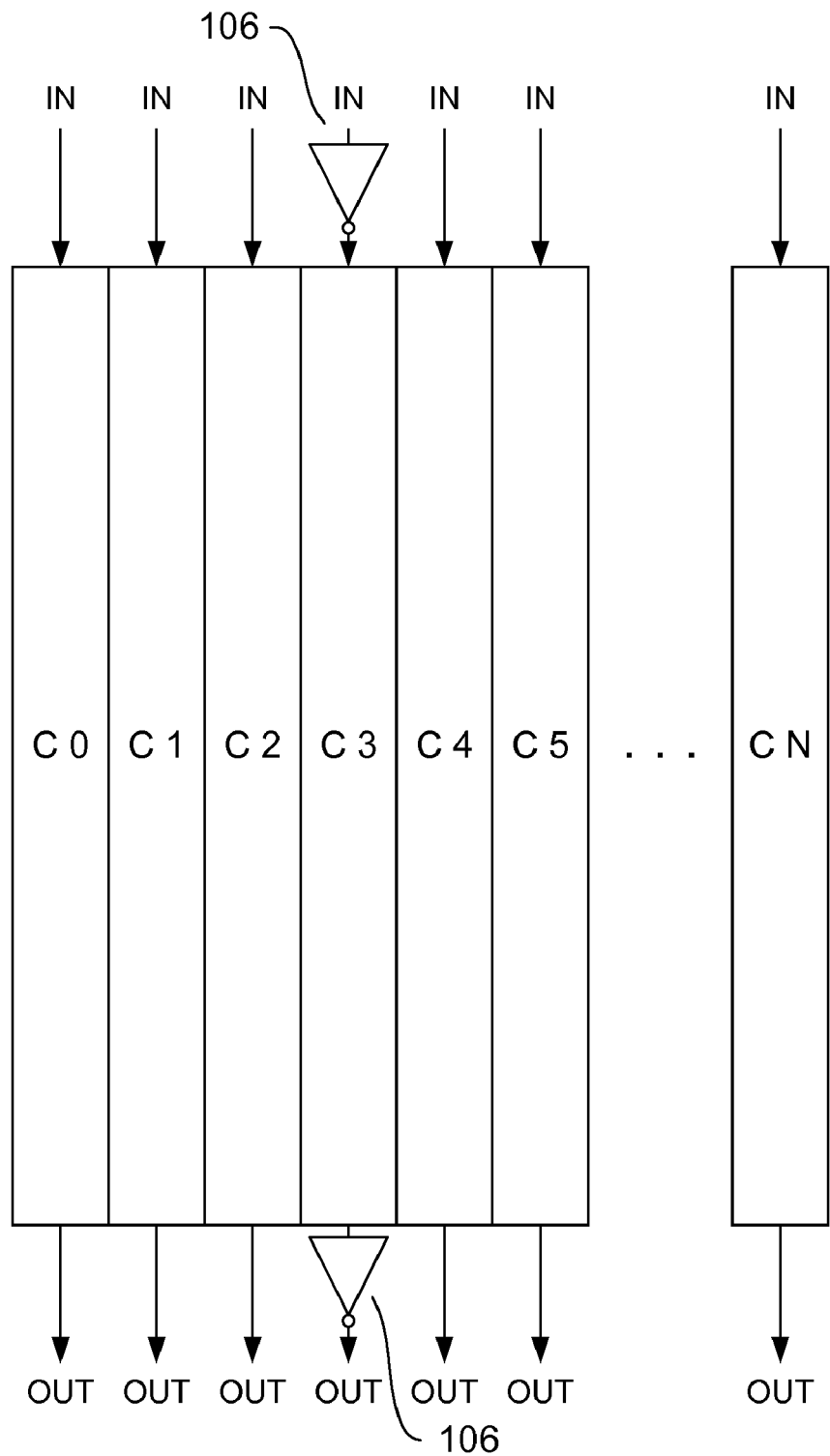
FIG. 3 is a block diagram illustrating the SRAM memory system of FIG. 1 including a inversion circuit in accordance with one or more embodiments of the present invention.

Reference is now made to FIG. 3, which illustrates further details of the SRAM memory system 100 in accordance with one or more further embodiments of the present invention. In particular, the system 100 includes an inverter circuit 106 coupled to at least one of the columns, such as column C3. The inverter circuit 106 is operable to invert values of data for input to the column C3 such that inverted data are stored in at least one (and preferably all) of the memory cells 102 of the column C3. In addition, the inverter circuit 106 is operable to invert the values of the inverted data accessed from the memory cells 102 of the column C3 during read operations.

It is noted that the above description and use of the inverter circuit 106 has application when, for example, such use would result in a lower power consumption (and/or dissipation) of the SRAM memory system 100. Thus, one or more embodiments of the invention contemplate performing an analysis of the data for input into the array to determine whether the data for input to, for example, column C3 (and/or other columns) are more likely to cause a higher level of power consumption during a read operation than without the inversion step. In accordance with one or more embodiments, the determination may be in the affirmative when the number of data bits in the column C3 are more likely to be at a logic level low than at a logic level high. Recall the description above where, during a read operation, if true node A is low, the power dissipation in the memory cell 102 is relatively high because current flows through two transistors TR1 and TR2. Conversely, if the true node A is high, the power dissipation in the memory cell is relatively lower because current flows through only one transistor TR3.

Figure 4A:
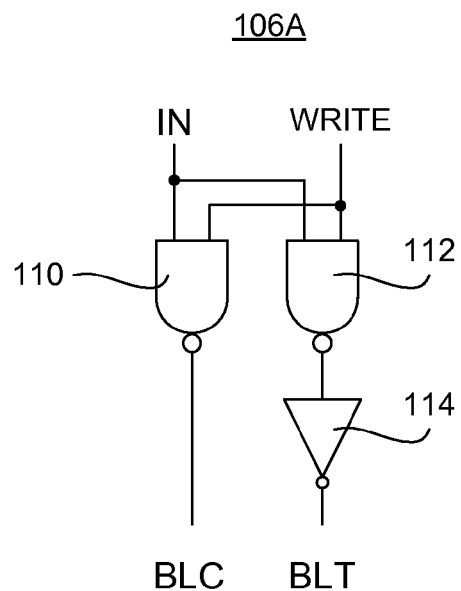
FIGS. 4A-4B illustrate detailed circuit diagrams of alternative implementations of the inversion circuit of FIG. 3.
Figure 4B:
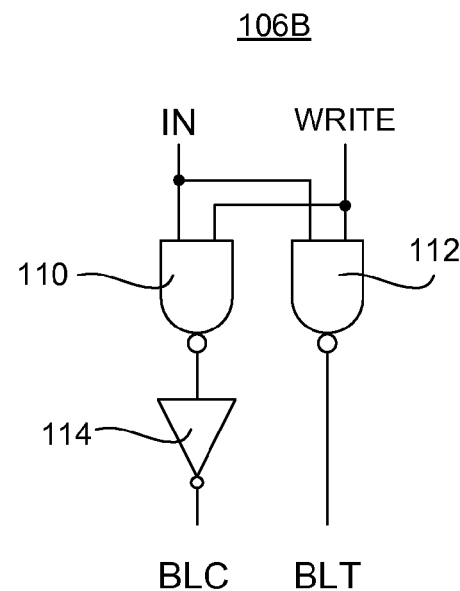

With reference to FIGS. 4A-4B, two of the many ways of implementing the inverter circuit 106 are shown. In each implementation, the inverter circuits 106A, 106B include a number of logic gates 110, 112, 114 to invert the states of the bit lines BLT, BLC, for example, on a data write operation. Those skilled in the art will appreciate that numerous circuit implementations are available for the inverter circuit 106, whether for the input (write) operation or the output (read) operation.

Figure 5:
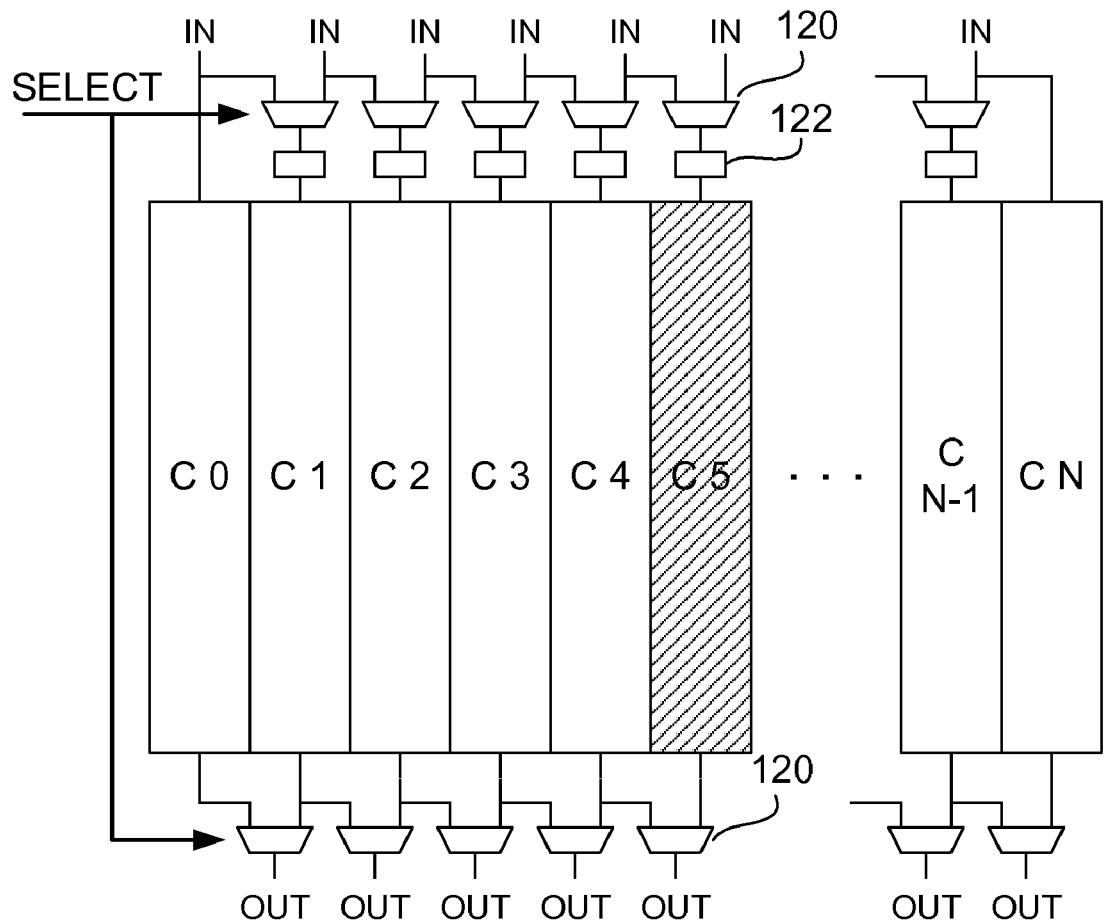
FIG. 5 is a block diagram illustrating the SRAM memory system of FIG. 1 including a control circuit for setting the stored values of a failed column in accordance with one or more embodiments of the present invention.

Reference is now made to FIG. 5, which illustrates further details of the SRAM memory system 100 in accordance with one or more further embodiments of the present invention. In accordance with this embodiment of the present invention, it is contemplated that the SRAM array includes one or more redundant columns, such that a failure in one or more memory cells of a given column can be repaired by shifting the input data stream from the failed column directly or indirectly into a redundant column. For example, if column C5 is failed (or otherwise is not to be used in normal operation) then the input and output data streams may be channeled to an adjacent column by way of appropriate control of selectors 120.

In accordance with one or more embodiments of the present invention, the system 100 also includes a control circuit 122 coupled to at least one (and preferably all) of the columns. The control circuit 122 is operable to set values of data for storage into the at least one column, such as column C5, that are more likely to cause a lower level of power consumption during read operations as compared with power consumption that would arise if inverted values of the data existed. Preferably, the set values are logic level high.

Figure 6A:
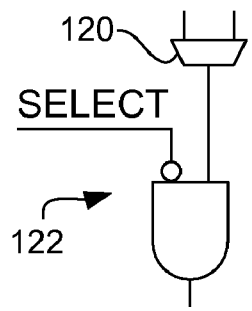
FIGS. 6A-6B illustrate detailed circuit diagrams of alternative implementations of the control circuit of FIG. 5.
Figure 6B:
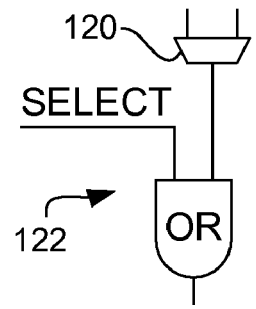

With reference to FIGS. 6A-6B, two of the many ways of implementing the control circuit 122 are shown. In each implementation one or more logic gates are employed to set the data to logic high, which set data are input to the column during a data write operation. Those skilled in the art will appreciate that numerous circuit implementations are available for the control circuit 122.

Advantageously, the use of data inversion to establish a higher occurrence of logic high levels being stored in the SRAM memory system 100 results in significant reduction of power dissipation in the memory system 100, particularly when successive read operations are performed at a relatively high frequency.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of controlling a static random access memory (SRAM memory, the SRAM memory including a plurality of memory cells arranged in an array of rows (word lines) and columns (bit lines), comprising:
   inverting a state of data for input to one or more columns of the array;
   storing the inverted data in one or more memory cells of the one or more columns; and
   performing analysis of data for input into the array to determine whether the data for input to the one or more columns are more likely to cause a higher level of power consumption during a read operation than without the inversion step.

2. The method of claim 1, further comprising:
   accessing the inverted data from the one or more memory cells; and
   inverting the state of the inverted data.

3. The method of claim 1, wherein the determination is in the affirmative when a number of data bits in the one or more columns are more likely to be at a logic level low.

4. The method of claim 3, wherein a given data bit in the one or more columns is a logic level low when a true node (BLT) of the associated memory cell is at a low voltage potential and a complementary node (BLC) of the associated memory cell is at a higher voltage potential than the true node (BLT).

5. A method of controlling a static random access memory (SRAM memory), the SRAM memory including a plurality of memory cells arranged in an array of rows (word lines) and columns (bit lines), comprising performing analysis of data for input into the array to determine whether values of the data for input to one or more columns are more likely to cause a higher level of power consumption during read operations as compared with power consumption that would arise if inverted values of the data for input to one or more columns existed.

6. The method of claim 5, further comprising inverting the values of the data for input to the one or more columns of the array when the analysis indicates that the values are more likely to cause a higher level of power consumption during read operations.

7. The method of claim 6, further comprising storing the inverted data in one or more memory cells of the one or more columns.

8. The method of claim 7, further comprising:
   accessing the inverted data from the one or more memory cells; and
   inverting the values of the inverted data.

9. A method of controlling a static random access memory (SRAM memory), the SRAM memory including a plurality of memory cells arranged in an array of rows (word lines) and columns (bit lines), comprising:
   determining whether one or more of the columns of the array are not to be used in a normal mode of operation; and
   storing data in at least one of the one or more columns having values that are more likely to cause a lower level of power consumption during read operations as compared with power consumption that would arise if inverted values of the data existed.

10. The method of claim 9, wherein the values are logic level high.

11. The method of claim 10, wherein the values are logic level high when, for a given memory cell, a true node (BLT) of the memory cell is at a high voltage potential and a complementary node (BLC) of the memory cell is at a lower voltage potential than the true node (BLT).

12. A static random access memory (SRAM memory) system, comprising:
   a plurality of memory cells arranged in an array of rows (word lines) and columns (bit lines), each of the one or more memory cells including an anti-parallel configuration defining a true bit line (BLT), and a complementary line (BLC); and
   an inverter circuit coupled to at least one of the columns and operable to: (i) invert values of data for input to the at least one column such that inverted data are stored in one or more memory cells of the at least one column; and (ii) drive the true bit line (BLT) to a high voltage potential and the complementary bit line (BLC) to a lower voltage potential than the true bit line (BLT) when the value of the input data is a logic low level.

13. The SRAM memory system of claim 12, wherein the inverter circuit is further operable to invert the values of the inverted data accessed from the one or more memory cells of the at least one column during read operations.

14. A static random access memory (SRAM memory) system, comprising:
- a plurality of memory cells arranged in an array of rows (word lines) and columns (bit lines); and
- a control circuit coupled to at least one of the columns and operable to set values of data for storage into the at least one column that are more likely to cause a lower level of power consumption during read operations as compared with power consumption that would arise if inverted values of the data existed.

15. The SRAM memory system of claim 14, wherein the set values are logic level high.

16. The SRAM memory system of claim 14, wherein:
- each of the one or more memory cells includes an anti-parallel configuration defining a true bit line (BLT), and a complementary line (BLC); and
- the control circuit is operable to drive the true bit line (BLT) to a high voltage potential and the complementary bit line (BLC) to a lower voltage potential than the true bit line (BLT).

17. The SRAM memory system of claim 14, wherein the one or more of the columns of the array are not to be used in a normal mode of operation.

18. The SRAM memory system of claim 17, wherein the one or more of the columns of the array are failed.

* * * * *